United States Patent
Dreps et al.

(10) Patent No.: US 8,543,753 B2
(45) Date of Patent: Sep. 24, 2013

(54) MULTI-USE PHYSICAL ARCHITECTURE

(75) Inventors: Daniel M. Dreps, Georgetown, TX (US); Kyu-hyoun Kim, Mount Kisco, NY (US); Michael A. Sorna, Hopewell Junction, NY (US); Glen A. Wiedemeier, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 210 days.

(21) Appl. No.: 13/080,799

(22) Filed: Apr. 6, 2011

(65) Prior Publication Data
US 2012/0260016 A1  Oct. 11, 2012

(51) Int. Cl.
*G06F 1/10* (2006.01)
*G06F 13/38* (2006.01)

(52) U.S. Cl.
CPC ............... *G06F 13/385* (2013.01); *G06F 1/10* (2013.01)
USPC .......................................... 710/305; 713/500

(58) Field of Classification Search
USPC .......................................................... 710/305
See application file for complete search history.

(56) References Cited

U.S. PATENT DOCUMENTS

| | | | | |
|---|---|---|---|---|
| 5,243,623 A * | 9/1993 | Murdock | ....................... | 375/220 |
| 5,929,655 A * | 7/1999 | Roe et al. | ......................... | 326/82 |
| 6,243,776 B1 * | 6/2001 | Lattimore et al. | ............ | 710/104 |
| 6,457,089 B1 * | 9/2002 | Robbins et al. | ................ | 710/306 |
| 6,516,352 B1 * | 2/2003 | Booth et al. | ................... | 709/250 |
| 6,703,866 B1 * | 3/2004 | Arimilli et al. | ................. | 326/86 |
| 6,851,014 B2 * | 2/2005 | Chang et al. | ................... | 711/103 |
| 6,895,447 B2 * | 5/2005 | Brewer et al. | .................... | 710/11 |
| 6,959,356 B2 * | 10/2005 | Packwood et al. | ............ | 710/315 |
| 7,032,045 B2 * | 4/2006 | Kostadinov | ..................... | 710/105 |
| 7,158,536 B2 * | 1/2007 | Ching et al. | .................. | 370/468 |
| 7,171,499 B2 * | 1/2007 | Kelley et al. | ................... | 710/104 |
| 7,243,176 B2 * | 7/2007 | To et al. | ........................ | 710/106 |
| 7,249,213 B2 * | 7/2007 | Feng et al. | ..................... | 710/305 |
| 7,254,657 B1 | 8/2007 | Lanfield et al. | | |
| 7,420,990 B2 * | 9/2008 | Ching et al. | .................. | 370/468 |
| 7,451,244 B2 * | 11/2008 | Kostadinov | ...................... | 710/11 |
| 7,627,704 B2 * | 12/2009 | Croyle et al. | .................. | 710/105 |
| 7,647,445 B2 * | 1/2010 | Drescher et al. | .............. | 710/306 |
| 7,730,251 B2 * | 6/2010 | Jeanjean | ........................ | 710/300 |
| 7,853,638 B2 * | 12/2010 | Wilson et al. | ................. | 709/200 |
| 7,870,319 B2 * | 1/2011 | Croyle et al. | .................. | 710/105 |
| 8,073,009 B2 * | 12/2011 | Ching et al. | ................... | 370/468 |

(Continued)

OTHER PUBLICATIONS

Null et al.; "The Essentials of Computer Organization and Architecture"; Jones and Bartlett; Second Edition; 2006; pp. 144-145; available online at http://books.google.com/books?id=QGPHAI9GE-IC.*

*Primary Examiner* — Ryan Stiglic
(74) *Attorney, Agent, or Firm* — Cantor Colburn LLP

(57) ABSTRACT

A multi-use physical (PHY) architecture that includes a PHY connection that includes one or more bit lines and that is communicatively coupled to a first processor. The PHY connection is configurable to carry signals between the first processor and a second processor, or between the first processor and a memory. The one or more bit lines are configured to carry signals bi-directionally at a first voltage when the PHY connection is configured to carry signals between the first processor and the memory. The one or more bit lines are configured to carry signals uni-directionally at a second voltage when the PHY connection is configured to carry signals between the first processor and the second processor. The second voltage is different than the first voltage.

17 Claims, 10 Drawing Sheets

(56) References Cited

U.S. PATENT DOCUMENTS

| | | | |
|---|---|---|---|
| 8,149,874 B2 * | 4/2012 | Ching et al. | 370/468 |
| 8,161,200 B2 * | 4/2012 | Kostadinov | 710/11 |
| 8,296,494 B1 * | 10/2012 | Sheffield | 710/305 |
| 2004/0186941 A1 * | 9/2004 | Peng | 710/312 |
| 2004/0268000 A1 * | 12/2004 | Barker et al. | 710/301 |
| 2005/0243531 A1 * | 11/2005 | Kulpa et al. | 361/783 |
| 2006/0000917 A1 * | 1/2006 | Kim et al. | 235/492 |
| 2007/0143520 A1 * | 6/2007 | Yang et al. | 710/306 |
| 2008/0140907 A1 * | 6/2008 | Dreps et al. | 711/100 |
| 2008/0189457 A1 * | 8/2008 | Dreps et al. | 710/106 |
| 2009/0177819 A1 * | 7/2009 | Kang | 710/105 |
| 2010/0122107 A1 * | 5/2010 | Arimilli et al. | 713/600 |

* cited by examiner

MULTI-USE PHYSICAL ARCHITECTURE

BACKGROUND

The present invention relates generally to a computer processing system, and more specifically to a multi-use physical (PHY) architecture in a computer processing system.

Computer and communication systems often have components that are "input/output (I/O) bound" or "pin limited." This means that, for example, a microprocessor may be unable to implement all of the functions that are desired due to limitations in the physical size of the silicon, or that the packaging of the chip prevents implementation of the needed number of I/O's. In contemporary system architectures interface buses are generally designed for a specific purpose. For instance, systems often contain dedicated processor interconnect buses, and separate memory buses. In many cases multiple architectures must be implemented to support varied functionality. For example, a lower end system may require fewer processor interconnects, while higher end systems may require more processor interconnects and a large amount of memory. These requirements are often determined by the system configuration and/or by the customer price/performance point that is desired. In these cases, despite implementing similar processor and memory systems for both high-end and lower end systems, the bus systems must be designed differently in order to support each of the customer requirements.

In contemporary memory systems, differing memory devices can be used on a single bus when that bus supports such capabilities. For example, an un-buffered memory dual in-line memory module (DIMM) can be attached to the same bus that a buffered memory DIMM can be attached to, as long as industry standard timing parameters are adhered to for each of the different memory modules. This flexible configuration capability, however, it is not possible between memory modules and computer processors due to incompatible voltage levels and bus design (e.g., single-ended buses vs. differential buses).

BRIEF SUMMARY

An embodiment is a multi-use physical (PHY) architecture that includes a PHY connection. The PHY connection includes one or more bit lines, and is communicatively coupled to a first processor. The PHY connection is configurable to carry signals between the first processor and a second processor, or between the first processor and a memory. The one or more bit lines are configured to carry signals bi-directionally at a first voltage when the PHY connection is configured to carry signals between the first processor and the memory. The one or more bit lines are configured to carry signals uni-directionally at a second voltage when the PHY connection is configured to carry signals between the first processor and the second processor. The second voltage is different than the first voltage.

Another embodiment is a computer implemented method for configuring a multi-use PHY connection. The method includes determining if the multi-use PHY connection connects a first processor to a memory or to a second processor. The multi-use PHY connection is configured, via a system programming module. The configuring of the multi-use PHY includes setting one or more bit lines to carry signals uni-directionally in response to determining that the multi-use PHY connection connects the first processor to the second processor. Alternatively, the configuring of the multi-use PHY includes setting the one or more bit lines to carry signals bi-directionally in response to determining that the multi-use PHY connection connects the first processor to the memory.

A further embodiment is a multi-use PHY connection that includes a first pad communicatively coupled to a second pad via one or more bit lines. The first pad is communicatively coupled to a first processor. The first pad is configurable to carry signals between the first processor and the second pad. The second pad is communicatively coupled to a second processor, or to a memory. The one or more bit lines are configured to carry signals bi-directionally at a first voltage when the second pad is communicatively coupled to the memory. The one or more bit lines are configured to carry signals uni-directionally at a second voltage when the second pad is communicatively coupled to the second processor. The second voltage is different than the first voltage.

Additional features and advantages are realized through the techniques of the present embodiment. Other embodiments and aspects are described herein and are considered a part of the claimed invention. For a better understanding of the invention with the advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

In an embodiment, a plurality of physical (PHY) connectors share a single pin and are configured to provide, over a single bus type, communication between two or more processors, or to provide communication between a processor and a plurality of memory devices. An embodiment further includes circuits and logic to convert bi-directional pins into uni-directional pins, and to adjust for signal loss with amplification circuitry and alternate voltage configurations.

Figure 1:
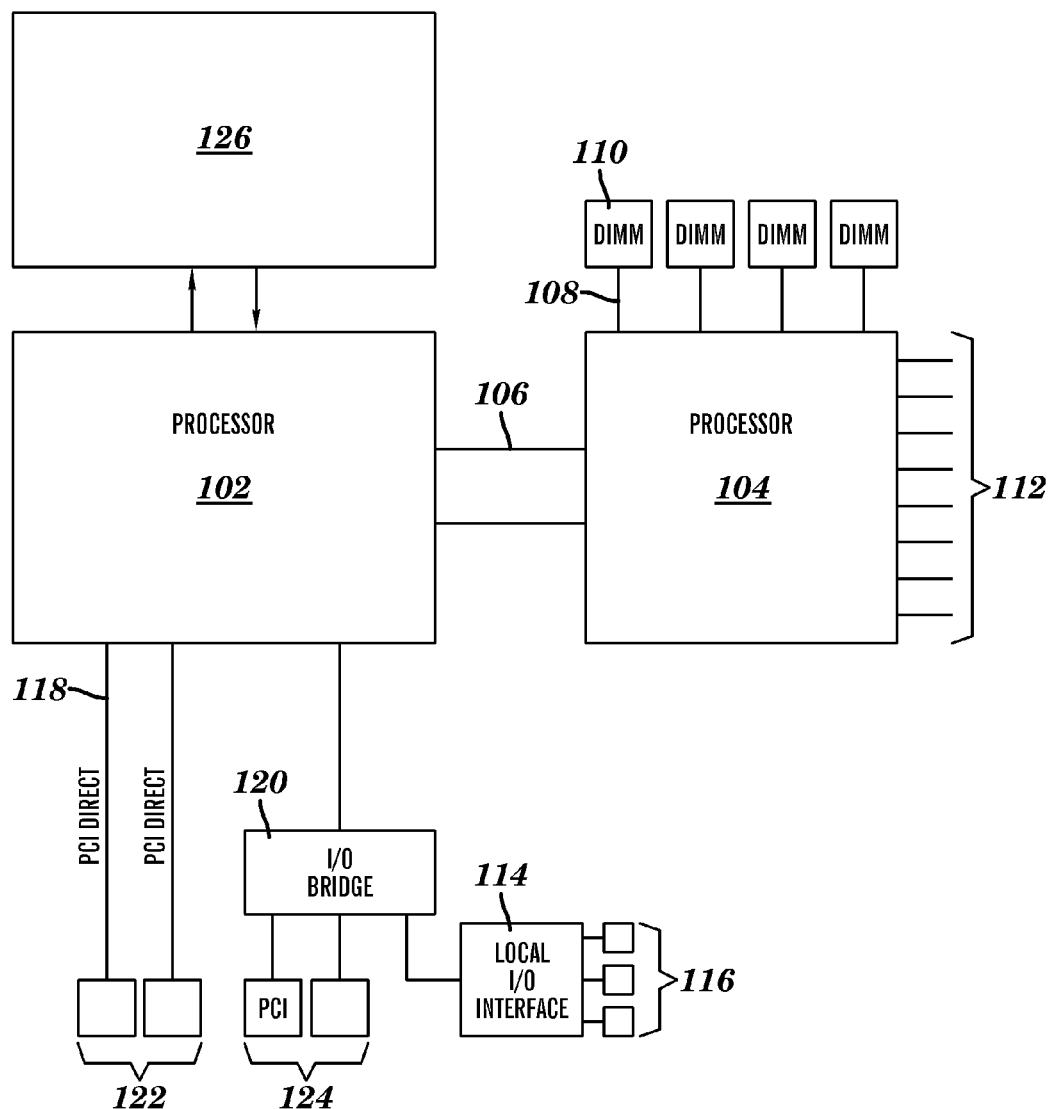
FIG. 1 illustrates a block diagram of a computer system in accordance with an embodiment.

FIG. 1 illustrates a block diagram of a computer system in accordance with an embodiment. As shown in FIG. 1, a first processor 102 is connected to a second processor 104 over one or more pins 106, and to one or more additional processors 126. In an additional embodiment, the first processor 102 is connected to one or more dual in-line memory modules (DIMMs) (not shown). The second processor 104 is also connected to one or more DIMMs 110 over one or more pins 108. In one embodiment, the pins 108 are physical wires or bit lines connected to the DIMMs 110. In an alternate embodiment, the second processor 104 is connected to the DIMMs 110 through a memory bus that includes bit lines as is known in the art. In an embodiment, the second processor 104 has additional pins 112 used for communication to an additional processor, or memory devices as will be described in more detail below.

The pins 108 and memory bus are examples of ways to "communicatively couple" the DIMMs 108 to the second processor 104. As used herein, the term "communicatively coupled" refers to providing a path for two elements (e.g., processor, DIMM, a PHY connection, etc.) to communicate with each other (e.g., via a bus, a pin, etc.). Thus, when two devices are communicatively coupled, they are in communication with each other to send data signals.

As shown in FIG. 1, the first processor 102 is communicatively coupled to a PCI connection bus 118, which is coupled to one or more PCI devices 122. The first processor 102 is also communicatively coupled to an input/output (I/O) bus 120. The I/O bus 120 is communicatively coupled to one or more I/O devices 124, and one or more local I/O interfaces 114. In an embodiment, the one or more local I/O interfaces 114 are communicatively coupled to one or more local I/O devices 116. In an embodiment the one or more local I/O devices 116 include one or more of a local disk drive, a display, a keyboard, and a non-volatile memory.

Although the first processor 102 and the second processor 104 depicted in FIG. 1 include a number of exclusive connections to various components, it will be understood that in embodiments, each of the processors retain the functionality to connect directly to memory such as DIMMs 110, to other processors, and to other devices such as the PCI devices 122, and the I/O devices 124, the local I/O interface 114, and the local I/O devices 116. FIG. 1 is simplified for clarity and is not meant to limit the systems to any particular embodiment, or combination of elements. In additional embodiments other components and processors may be added or removed without affecting the functionality of the multi-use PHY architecture.

Figure 2:
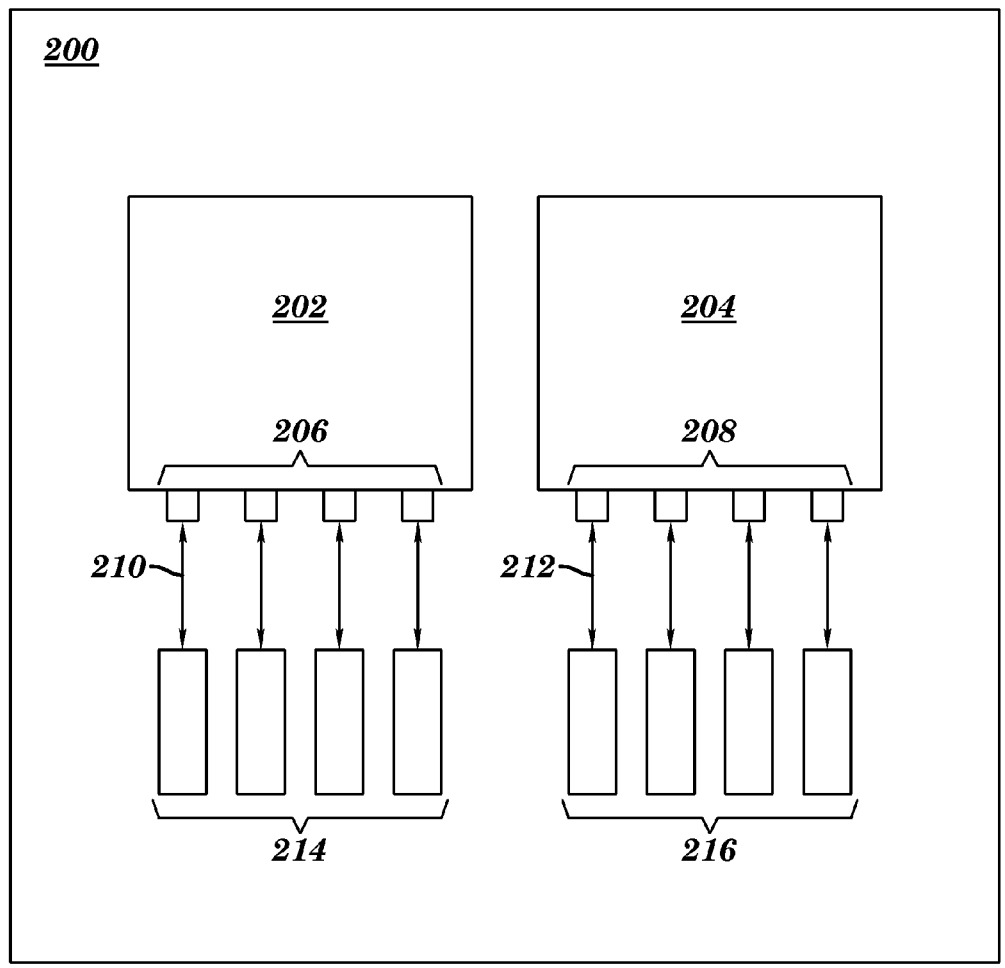
FIG. 2 illustrates a block diagram of a low-end computer system in accordance with an embodiment.

FIG. 2 illustrates a block diagram of a low-end system 200 in accordance with an embodiment. The low-end system 200 of FIG. 2 includes a first processor 202 that has one or more multi-use PHY connections 206. In an embodiment, the multi-use PHY connections 206 are part of a processor and memory socket. In additional embodiments the multi-use PHY connections 206 are part of the system board onto which the memory and processors are installed. The multi-use PHY connections 206 are communicatively coupled to one or more DIMMs 214 via one or more bit lines 212. In an embodiment, the DIMMs 214 are double data rate three (DDR3) memory modules. In an additional embodiment, the DIMMs 214 are double data rate four (DDR4) memory modules. The low-end system 200 additionally includes a second processor 204. In an embodiment, the second processor 204 includes one or more PHY connections 208. The PHY connections 208 are communicatively coupled to one or more DIMMs 216 via one or more bit lines. In an embodiment, the DIMMs 216 are DDR3 memory modules. In an additional embodiment, the DIMMs 216 are DDR4 memory modules.

In an embodiment the first processor 202 communicates with the DIMMs 214 via bit-lines that use standard memory communication protocols. In one embodiment, the first processor 202 and the second processor 204 communicate to the DIMMs 214 and 216 respectively using 72 data bits over 72 bi-directional data query (DQ) lines using a strobing clock signal as is known in the art. In an embodiment, the strobing clock signal is transmitted over a pair of differential data query strobes (DQS and DQS#). One pair of DQS and DQS# strobes are sent for every 4 bits (x4 DIMMs). In an alternate embodiment, one pair of DQS and DQS# strobes are sent for every 8 bits (x8 DIMMs). In an embodiment the first processor 202 and the second processor 204 are connected to each of the DIMMs 214 and 216 respectively using 72 DQ lines and 18 DQS lines for a x4 DIMM implementation. In an additional embodiment, the first processor 202 and the second processor 204 are connected to each of the DIMMs 214 and 216 respectively using 72 DQ lines and 9 DQS lines for a x8 DIMM implementation. In an embodiment, the data and data query strobes are transmitted at a specific voltage x based on the acceptable limits of the DIMM implementation. In one embodiment that voltage is 1.2 voltage (V), which allows communication with devices such as, but not limited to: a 1.35V DDR3, a 1.2V DDR3 and a 1.2V DDR4.

The low-end system 200 of FIG. 2 is simplified for clarity. It will be understood that in additional embodiments, additional processors and DIMMs may be used. In addition, in an embodiment the processors are communicatively coupled to I/O systems and devices. In additional embodiments, the processors of the low-end system 200 are communicatively coupled to one another.

Figure 3:
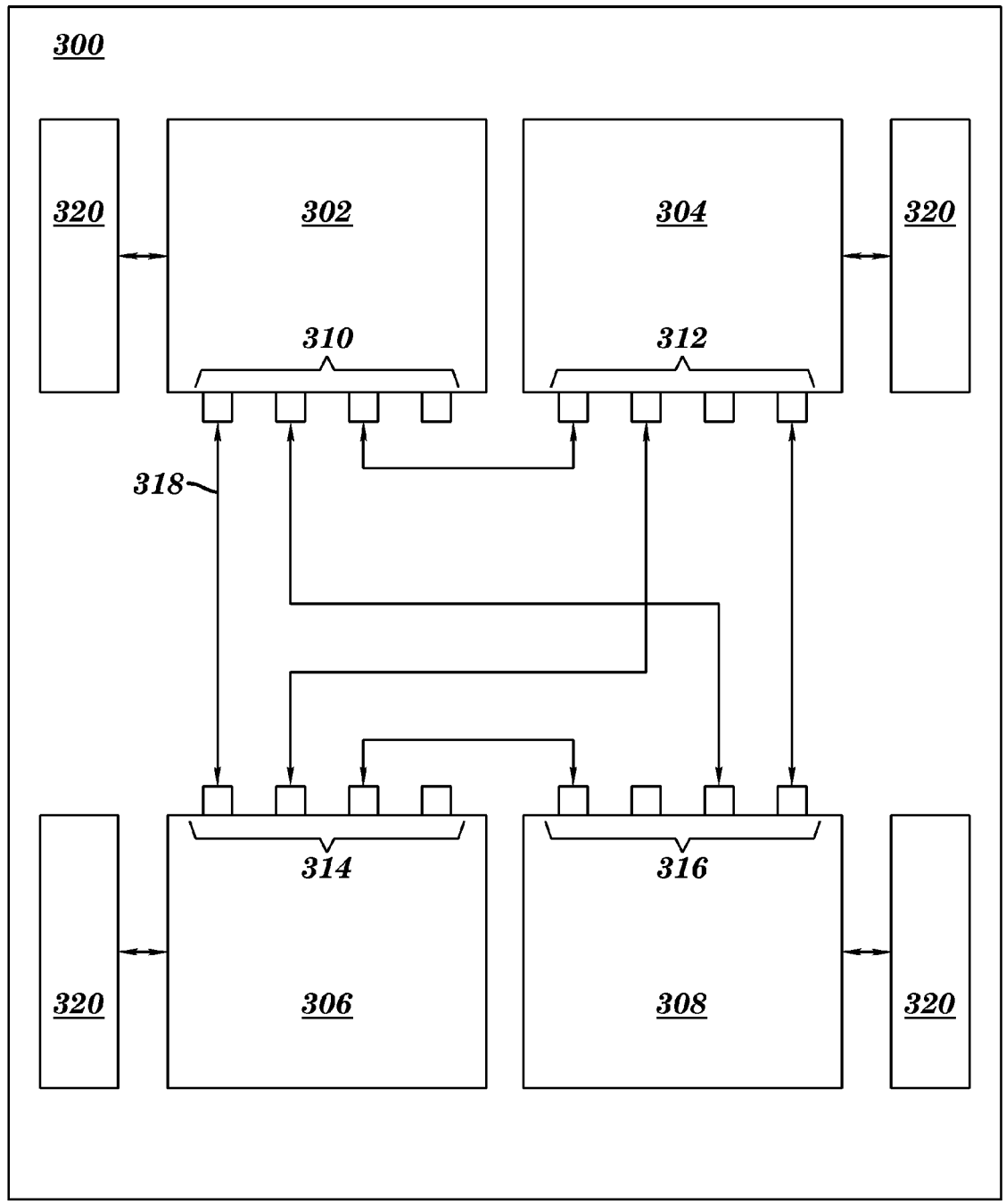
FIG. 3 illustrates a block diagram of a high-end computer system in accordance with an embodiment.

FIG. 3 illustrates a block diagram of a high-end system 300 in accordance with an embodiment. The high-end system 300 of FIG. 3 includes a first processor 302 that is communicatively coupled to a memory 320. In one embodiment, the memory 320 includes one or more DIMMs. In an embodiment the first processor 302 is additionally coupled to a second processor 304, a third processor 306, and a fourth processor 308 via a plurality of PHY connections 310 that include bit lines 318. In an embodiment, the second processor 304 is connected to each of the other processors through a plurality of PHY connections 312 and to the memory 320. The third processor 306 is connected to each of the other processors through a plurality of PHY connections 314 and to the memory 320. In an additional embodiment, the fourth processor 308 is connected to each of the other processors through a plurality of PHY connections 316 and to the memory 320. Using the PHY connections 310, 312, 314, and 316, all of the processors are interconnected. In an embodiment, the processors of the high-end system 300 communicate via an 80-bit uni-directional interface operating at voltage y. In an embodiment, the uni-directional interface uses the same voltage rail on chip and in an embodiment it is run at 1.0V-1.1V, with each processor, or chip, being dialed in the same way (e.g., bit lines 318). In an embodiment, the communication between the processors is clocked based on a continuous clock signal as opposed to the bursting strobe used in memory systems.

The PHY connections (310, 312, 314, and 316) between the processors are the same connections described above with regard to FIG. 2. In an embodiment, the PHY connections provide 72 bi-directional bit lines between the processors operating at voltage x. In an embodiment the PHY connections of each processor switch between bi-directional and uni-directional communications based on configuration settings. In an embodiment, the PHY connections switch between voltage x and voltage y based on the configuration settings as will be described in more detail below. In addition, the PHY connections switch between a strobed signal and a continuous clock signal based on the configuration settings. In additional embodiments, the PHY connections are configured to use the 72 data query bit lines as well as 8 of the data query strobe lines to provide 80 bit communication between the processors.

The high-end system 300 of FIG. 3 is simplified for clarity. It will be understood that in additional embodiments additional processors and DIMMs may be used. In addition, in an embodiment the processors are communicatively coupled to I/O systems and devices. In additional embodiments, the processors of the high-end system 300 are communicatively coupled to additional processors.

Although the PHY connections of FIGS. 2 and 3 connect to different buses (i.e. a memory bus and a processor I/O bus) the PHY's use a single oxide technology for both processor-to-processor and processor-to-memory connections. In addition, varying voltages are used to support reading and writing between processors and processor to memory using the same PHY.

Figure 4:
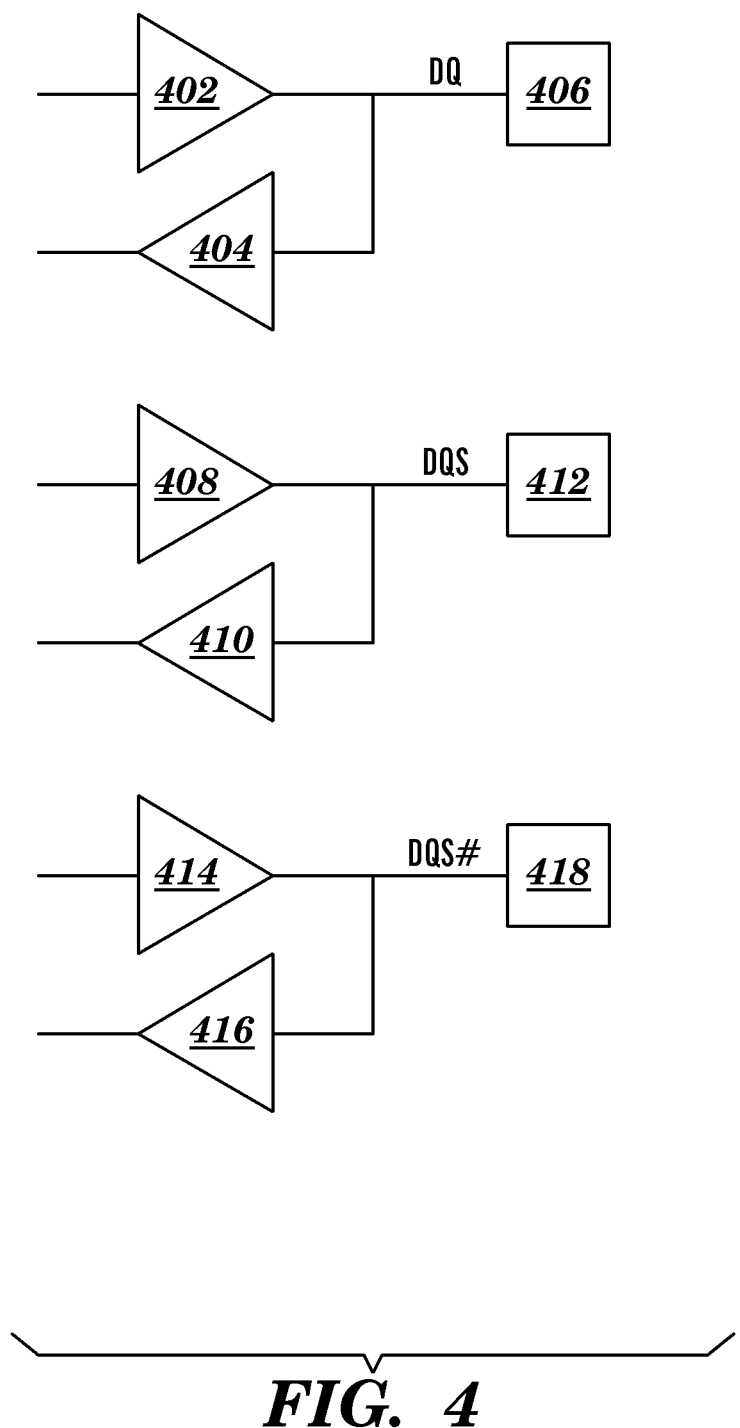
FIG. 4 illustrates a block diagram of a set of bit lines between a processor and memory in accordance with an embodiment.

FIG. 4 illustrates a block diagram of a set of bit lines between a processor and memory in accordance with an embodiment. In an embodiment, the bit lines of FIG. 4 provide communication between the processor and memory of FIG. 2. In an embodiment, the DQ has a DQ pad 406 (pad) for transmitting and receiving data. In an embodiment the DQ pad 406 is communicatively coupled to a PHY connection (not shown). In an additional embodiment, the PHY connection includes one or more DQ pads 406. The DQ pad 406 receives data over the received 402 based on a differential data query strobe signal provided by the DQS and DQS#. In addition, the DQ pad 406 transmits data through the DQ driver 404. The DQS includes a DQS pad 412. The DQS pad 412 receives one side of the differential data strobe from the DQS receiver 408. The DQS pad 412 transmits one half of the differential data strobe through the DQS driver 410. In an embodiment, the DQS# includes a DQS# pad 418. The DQS# pad 418 receives one side of the differential data strobe from the DQS# receiver 414, and transmits one half of the differential data strobe through the DQS# driver 416.

Figure 5A:
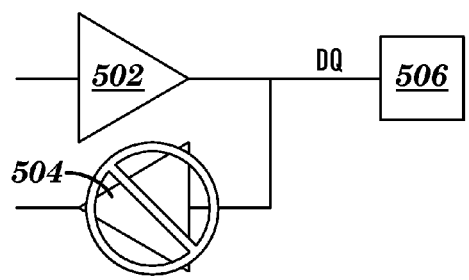
FIG. 5A illustrates a block diagram of a data query (DQ) bit line between two processors in accordance with an embodiment.

FIG. 5A illustrates a block diagram of a DQ bit line between two processors in an embodiment. In an embodiment, the bit lines of FIG. 5A provide communication between two processors in FIG. 3. In an embodiment, when PHY connections are configured to connect two processors, the DQ pad 506 receives data over the DQ receiver 502 and the DQ driver 504 is disabled. In an embodiment, by disabling the driver the DQ line becomes uni-directional.

Figure 5B:
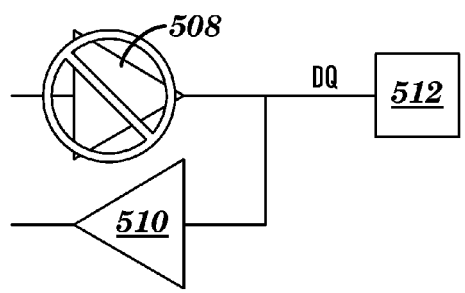
FIG. 5B illustrates a block diagram of a DQ bit line between two processors in accordance with an additional embodiment.

FIG. 5B illustrates a block diagram of a DQ bit line between two processors in an additional embodiment. In an embodiment, the bit lines of FIG. 5B provide communication between two processors in FIG. 3. In an embodiment, when PHY connections are configured to connect two processors, the DQ pad 512 sends data over the DQ driver 510 and the DQ receiver 508 is disabled. In an embodiment, by disabling the DQ receiver 508 the DQ line becomes uni-directional.

Figure 5C:
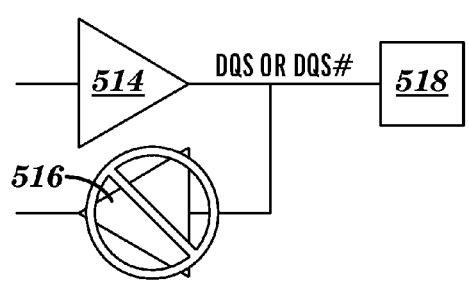
FIG. 5C illustrates a block diagram of a data query strobe (DQS) or DQS# bit line between two processors in accordance with an embodiment.

FIG. 5C illustrates a block diagram of a DQS or DQS# bit line between two processors in an embodiment. In an embodiment, the bit lines of FIG. 5C provide communication between two processors in FIG. 3. In an embodiment, when PHY connections are configured to connect two processors, the DQS or DQS# pad 518 receives data over the DQS or DQS# receiver 514 and the DQS or DQS# driver 516 is disabled. In an embodiment, by disabling the DQS or DQS# driver 516 the DQS or DQS# line becomes uni-directional.

Figure 5D:
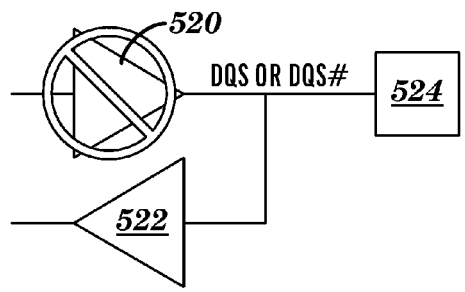
FIG. 5D illustrates a block diagram of a DQS or DQS# bit line between two processors in accordance with an additional embodiment.

FIG. 5D illustrates a block diagram of a DQS or DQS# bit line between two processors in an additional embodiment. In an embodiment, the bit lines of FIG. 5D provide communication between two processors in FIG. 3. In an embodiment, when PHY connections are configured to connect two processors, the DQS or DQS# pad 524 sends data over the DQS or DQS# driver 522 and the DQS or DQS# receiver 520 is disabled. In an embodiment, by disabling the DQS or DQS# receiver 520 the DQ line becomes uni-directional.

Figure 6A:
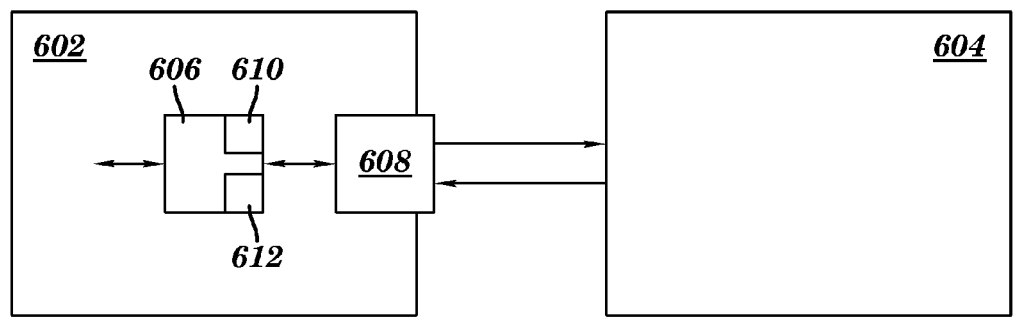
FIG. 6A illustrates a block diagram of a multi-use physical (PHY) architecture in accordance with an embodiment.

FIG. 6A illustrates a block diagram of a multi-use PHY architecture in accordance with an embodiment where a first processor 602 is communicatively coupled to a second processor 604 via one or more pads 608. The pad 608 is configured to transmit data using a continuous clock signal. In an embodiment, the pad 608 transmits and receives data at a voltage y. In an embodiment, the voltage used for data transmission is configurable and the pad 608 transmits data at a voltage set in the configuration. In an embodiment, the pad 608 is configured to use the bit lines between the processors to communicate uni-directionally. In an embodiment, the pad 608 is configured to disable one or more signal divers or signal receivers in order to use a bi-directional bit lane uni-directionally in a manner such as that shown in FIGS. 5C and 5D.

In an embodiment, data is sent from the pad 608 to processing module 606. In an embodiment, processing module 606 includes one or more phase rotators 610. The one or more phase rotators 610 are used to sample edges of the continuous clock cycle, and the data, and to provide an adjustable delay to the continuous clock and data signals in order to align the data wave with the clock cycle. In an additional embodiment, the processing module 606 includes one or more driver pre-emphasis and receiver peaking logic modules 612. The driver pre-emphasis and receiver peaking logic modules 612 amplify the processor-to-processor communication in order to correct a loss of amplitude that occurs in high-speed communication.

Figure 6B:
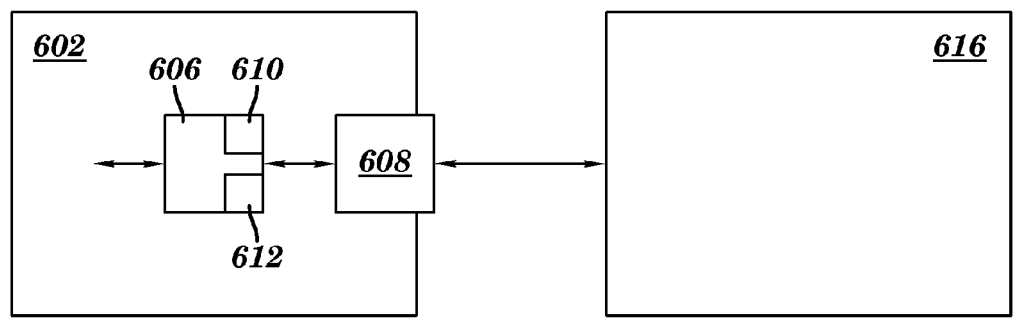
FIG. 6B illustrates a block diagram of a multi-use PHY architecture in accordance with an additional embodiment.

FIG. 6B illustrates a block diagram of a multi-use PHY architecture in an additional embodiment. In an embodiment, the first processor 602 is communicatively coupled to a memory device 616. The pad 608 is configured to transmit data using a bursting strobe signal. In an embodiment, the pad 608 transmits and receives data at a voltage x. In an embodiment, the pad 608 is configured to use the bit lines between the processors to communicate bi-directionally. In an embodiment, the pad 608 is configured to enable all of the signal divers or signal receivers in order to use the bit lines bi-directionally in a manner such as that shown in FIGS. 5A and 5B.

In an embodiment, data is sent from the pad 608 to processing module 606. In an embodiment, processing module 606 includes one or more phase rotators 610. The one or more phase rotators 610 are adjusted periodically to ensure that the DQS and the DQ are properly aligned.

The pad 608 and processing module 606 of FIGS. 6A and 6B are illustrated as two components for clarity. It will be understood that in an embodiment the pad 608 and processing module 606 of FIGS. 6A and 6B are combined into a single module. In additional embodiments, the pad 608 and processing module 606 include a plurality of distinct components for providing the functionality described in the FIGS. 6A and 6B.

In additional embodiments, the pad 608 and processing module 606 include additional functionality. In yet another embodiment, the pad 608 and processing module 606 include less functionality, or the functionality is distributed to other modules or components. In addition, it will be understood that in an embodiment, the first processor 602, and the processing module 606 of both FIGS. 6A and 6B are the same and are configurable to transmit data to both memory devices, such as the memory device 616 and a processor such as the second processor 604 without requiring a change in the processor 602 or the processing module 606. In one embodiment, the processing module 606 is configured to transmit data via software.

Figure 7:
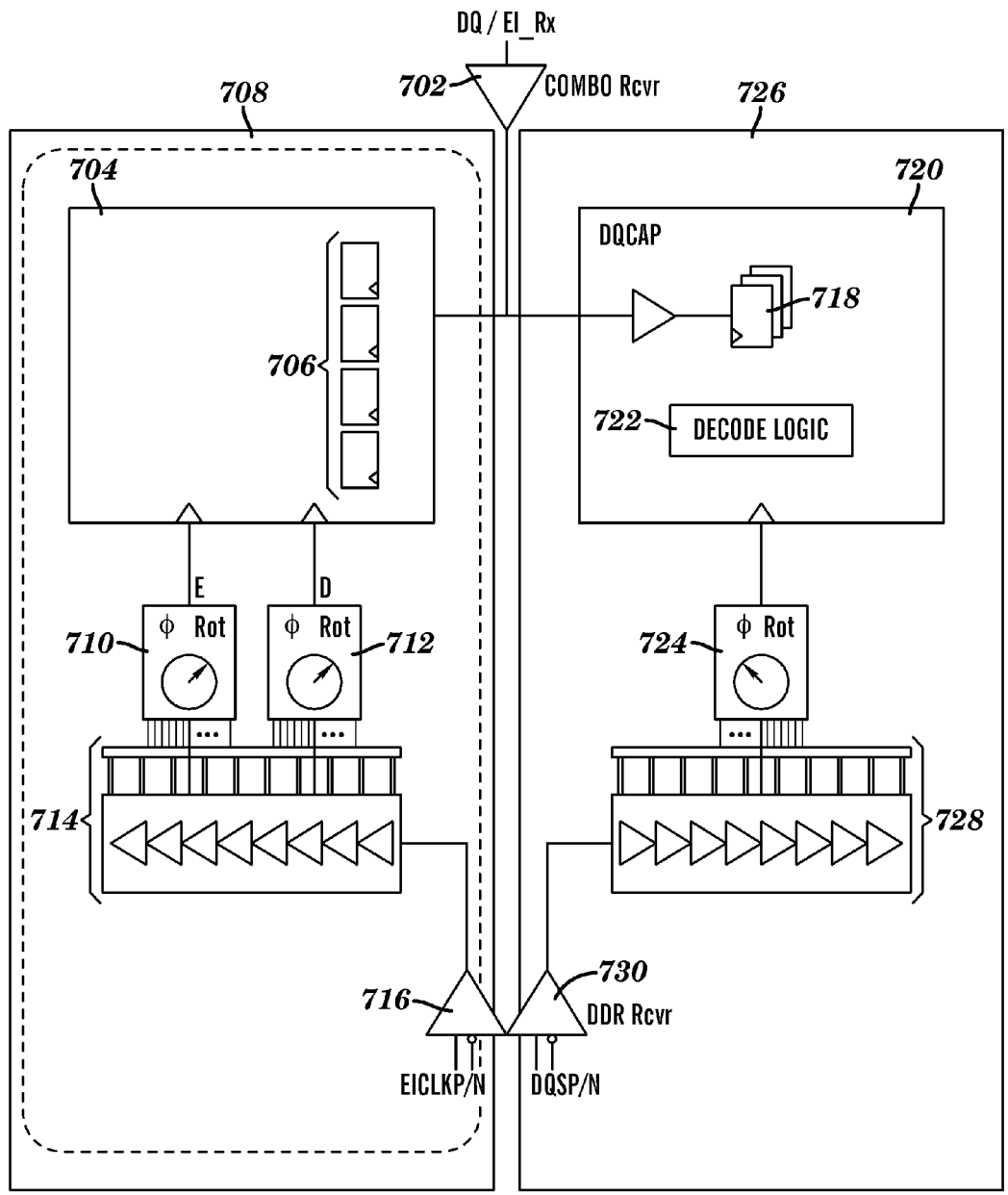
FIG. 7 illustrates a block diagram of a pad and processing module for receiving data in accordance with an embodiment.

FIG. 7 illustrates a block diagram of a pad and processing module for receiving data in an embodiment. In an embodiment, the pad and processing module illustrated in FIG. 7 are executed within the pad 608 and processing module 606 of FIGS. 6A and 6B. In an embodiment, the pad and processing module of FIG. 7 include processor module 708. The processor module 708 includes functionality for sending and receiving data at a processor in a multi-use PHY architecture. The processor module 708 receives data at a combination receiver 702 that is configured to receive data from both a memory and a processor in an embodiment. The data from the combination receiver 702 enters the processor at one or more receivers 706. In an embodiment, the processor module 708 receives a continuous clock signal from the processor receiver 716. The continuous clock signal is processed by a delay locked loop module 714, which buffers the clock signal. In an embodiment, the clock signal is then received at the edge phase rotator 710, and the data phase rotator 712 which adjust the clock phase to align it with the data received at the one or more receivers 706. The continuous clock signal is then sent to the receiving module 704 where it is used to collect data from the received data signal.

In an embodiment, the pad and processing module of FIG. 7 includes memory module 726. The memory module 726 includes functionality for sending and receiving data at a memory in a multi-use PHY architecture. The memory module 726 receives data at a combination receiver 702. The combination receiver 702 is configured to receive data for both a memory, and a processor in an embodiment. The data from the combination receiver 702 enters the memory at one or more receivers 718. In an embodiment the memory module 726 receives a bursting strobe signal at the signal receiver 730. The bursting strobe signal is buffered in the phase locked loop logic 728. The bursting strobe signal is processed by the memory phase rotator 724 which adjust the strobe signal to match the incoming data is known in the art. The bursting strobe signal is sent to the decode logic in the memory receiver module 720 and is combined with the data from the one or more receivers 718 where it is used to collect the received data.

In an embodiment, the pad and processing module of FIG. 7 is configured to process either memory requests or processor-to-processor requests. Based on the configuration setting the data is sent from the combination receiver 702 to either the processor module 708 or the memory module 726.

Figure 8:
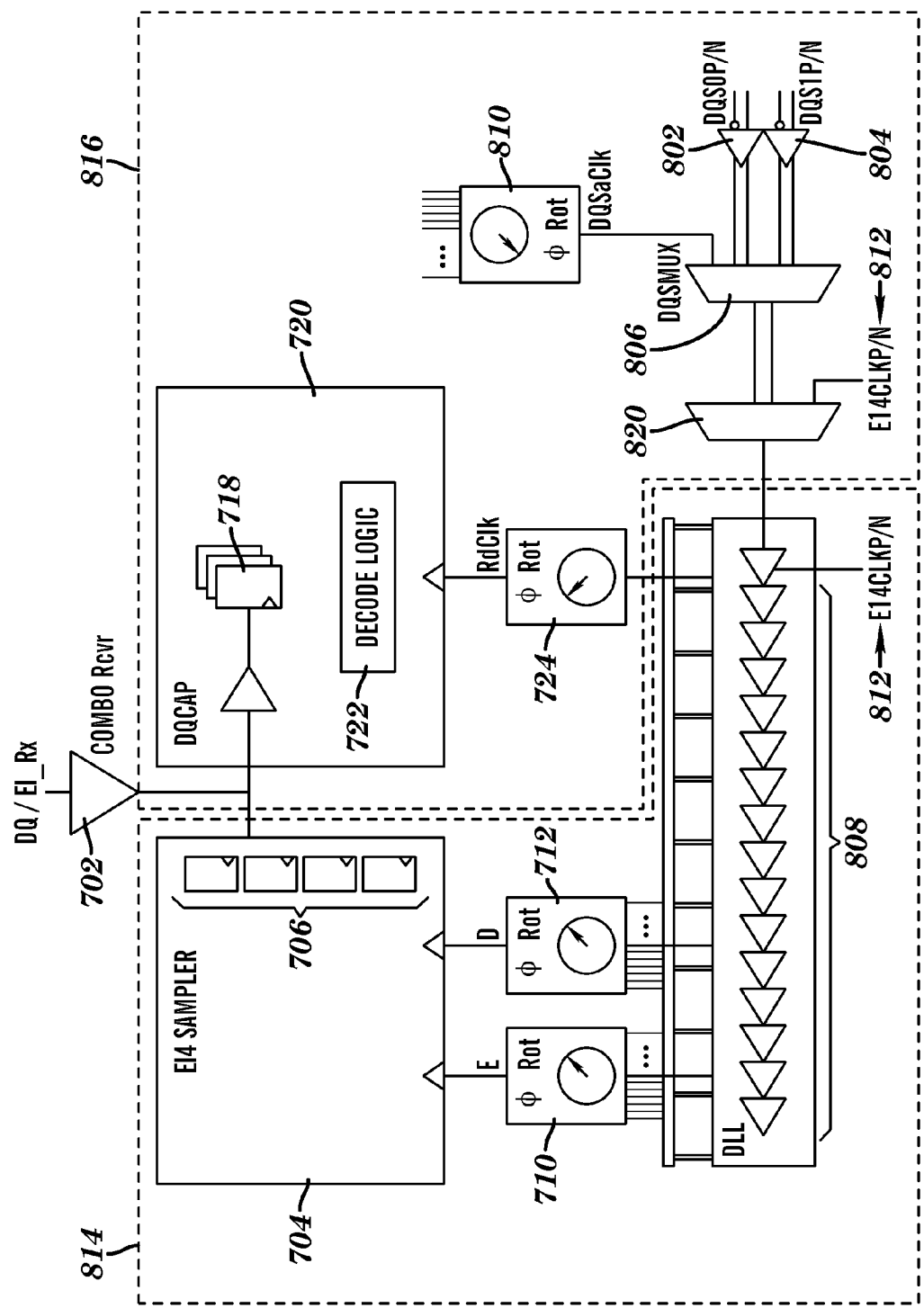
FIG. 8 illustrates a block diagram of a pad and processing module for receiving data in accordance with an embodiment.

FIG. 8 illustrates a block diagram of a pad and processing module for receiving data in accordance with an embodiment where a delay locked loop module 808 is shared between a processor module 814 and a memory module 816. In an embodiment, the pad and processing module illustrated in FIG. 8 are executed within the pad 608 and processing module 606 of FIGS. 6A and 6B. In an embodiment, the pad and processing module of FIG. 8 include processor module 814. The processor module 814 includes functionality for sending and receiving data at a processor in a multi-use PHY architecture. The processor module 814 receives data at a combination receiver 702 that is configured to receive data from both a memory and a processor in an embodiment. The data from the combination receiver 702 enters the processor at one or more receivers 706. In an embodiment, the processor module 814 receives a continuous clock signal from the processor receiver 812. The continuous clock signal is processed by a delay locked loop module 808, which buffers the clock signal. In an embodiment, the clock signal is then received at the edge phase rotator 710, and the data phase rotator 712 which adjust the clock phase to align it with the data received at the one or more receivers 706. The continuous clock signal is then sent to the receiving module 704 where it is used to collect data from the received data signal.

In an embodiment, the pad and processing module of FIG. 8 includes memory module 816. The memory module 816 includes functionality for sending and receiving data at a memory in a multi-use PHY architecture. The memory module 816 receives data at a combination receiver 702. The combination receiver 702 is configured to receive data for both a memory, and a processor in an embodiment. The data from the combination receiver 702 enters the memory at one or more receivers 718.

The phase rotator 810 flushes a free running clock to the DLL 808 to insure drift do to threshold voltages changes do not occur. This occurs when data is transmitted to memory via the memory module 816. When receiving from memory in x4 mode 802 is selected and when in x8 mode 804 is selected. When the interface is to the processor module 814, all paths of 806 are blocked off and the clock feeds directly in from 812. This selection is based on whether the combination receiver 702 is being fed data by a memory or by a processor, and is performed by multiplexer 820.

The bursting strobe signal is processed by the memory phase rotator 724 which adjust the strobe signal to match the incoming data is known in the art. The bursting strobe signal is sent to the decode logic in the memory receiver module 720 and is combined with the data from the one or more receivers 718 where it is used to collect the received data.

In an embodiment, the pad and processing module of FIG. 8 is configured to process either memory requests or processor-to-processor requests. Based on the configuration setting the data is sent from the combination receiver 702 to either the processor module 814 or the memory module 816.

Figure 9:
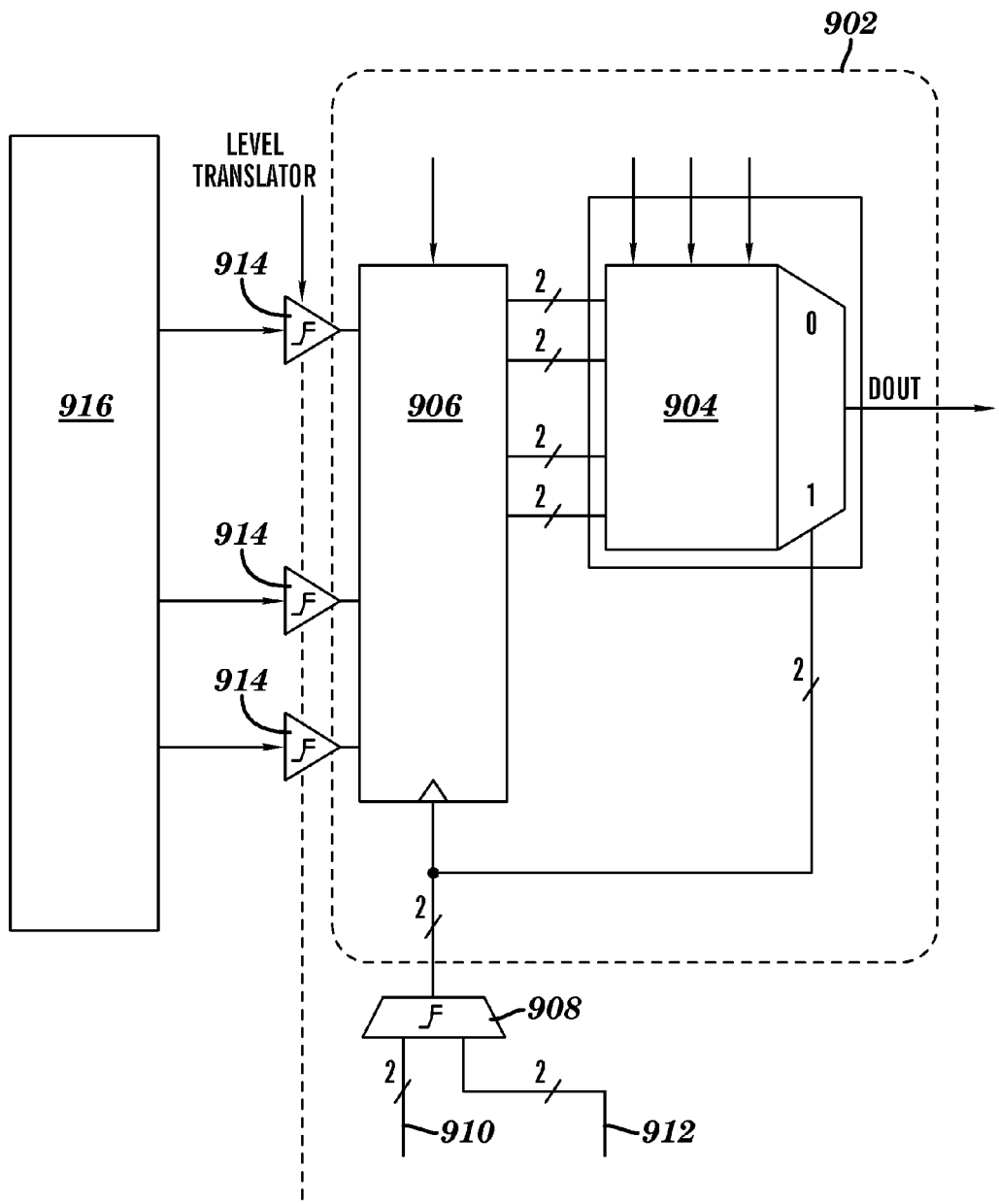
FIG. 9 illustrates a block diagram of a pad and processing module for sending data in accordance with an embodiment.

FIG. 9 illustrates a block diagram of a pad and processing module for sending data in accordance with an embodiment. In an embodiment, the pad and processing module illustrated in FIG. 9 is executed within the pad 608 and processing module 606 of FIGS. 6A and 6B. In an embodiment, a cell logic module 916 receives data to be sent to a memory (not shown) or a processor (not shown). In an embodiment, the cell logic module 916 drives the data to a write driver 902 via a plurality of level transistors 914. The level transistor 914 are optional and used when the core of the processor is a different voltage than that of the I/O cell. This allows for static and dynamic voltage scaling. For example, the core could vary from 0.8V to 1.2V in order to support a DDR mode I/O of 1.2 V and an 80 bit mode I/O of 1.0 V. The write driver 902 includes gating logic 904. The gating logic 904 receives data and breaks the data into components that can be sent to memory or processors. The gating logic 904 receives a clock signal from a clock multiplexer 908. The clock multiplexer 908 receives a bursting write clock signal 910 and a continuous clock signal 912. The clock multiplexer 908 is configured to select one of the clock signals depending on whether the write driver 902 is configured to write to a memory or a processor. The clock signal is received at the gating logic 904 and causes the gating logic 904 to drive data to the data-writing driver 906.

In an embodiment, the pad and processing module of FIG. 9 is configured to process either processor-to-memory requests or processor-to-processor requests. Based on the configuration setting the data is sent from the write driver 902 to either a processor a memory.

Figure 10:
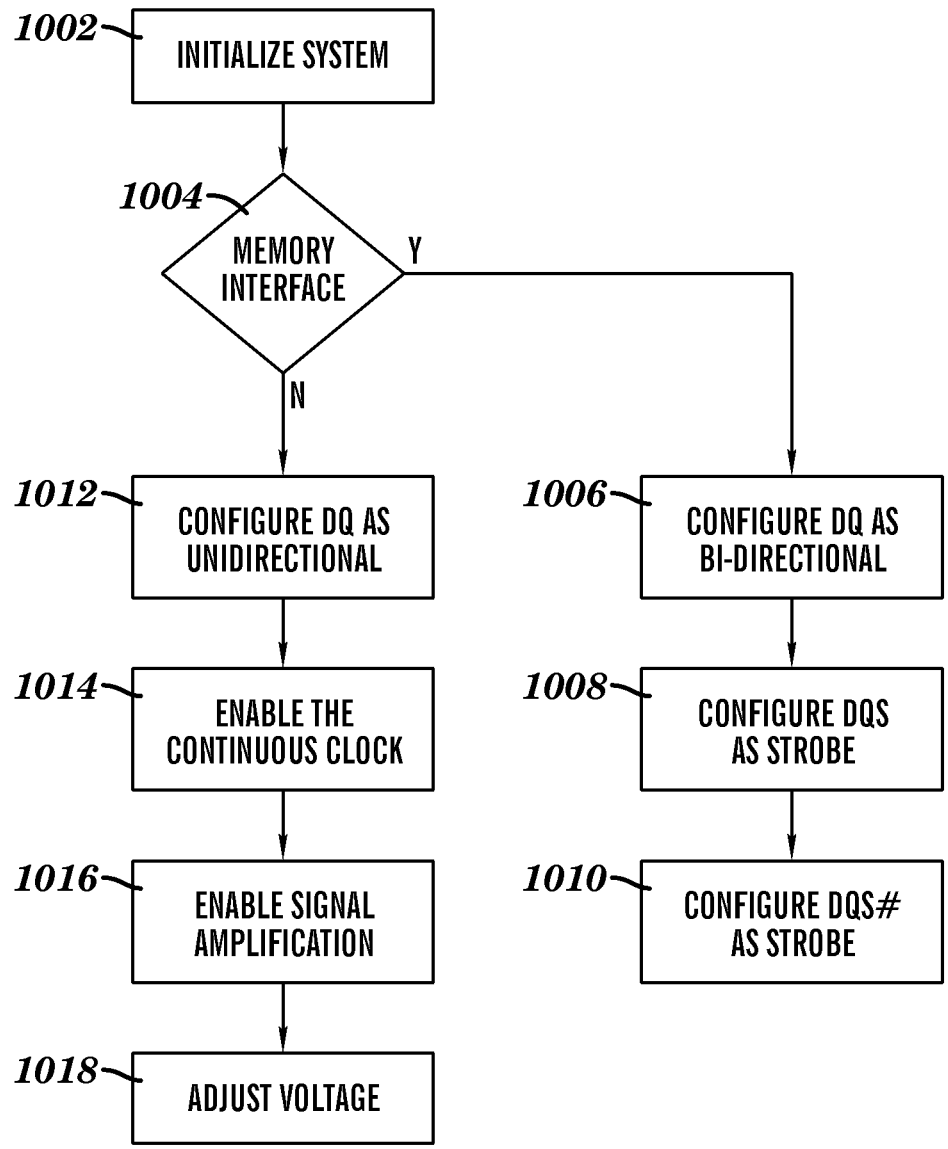
FIG. 10 illustrates a process flow for configuring the multi-use PHY architecture in accordance with an embodiment.

FIG. 10 illustrates a process flow for configuring the multi-use PHY architecture in an embodiment. In an embodiment the process flow of FIG. 10 is executed by a system programming module. In one embodiment, the system programming module is a computer processor executing code that configures the multi-use PHY architecture. At block 1002 the system is initialized. In an embodiment powering on the system initializes the system. In an alternate embodiment, programming the multi-use PHY architecture when it is being built initializes the system. At block 1004, if the PHY is being used to connect a processor to memory, the processing continues at block 1006. At block 1006, the DQ, DQS and DQS# bit lines are configured to operate bi-directionally. At block 1008, the DQS lines are configured to operate in bursting strobe mode. At block 1010, the DQS# lines are configured to operate in bursting strobe mode.

Returning to block 1004, if the PHY is being used to connect two processors, then processing continues at block 1012. At block 1012, the DQ, DQS, and DQS# lines are configured to operate uni-directionally. At block 1014, the continuous clock is enable to provide appropriate clocking for the processor-to-processor communication. At block 1016, signal amplification is enabled. At block 1018, the voltage of the signals is configured to support processor-to-processor communications.

Technical effects and benefits include enabling a single architecture to support both processor-to-processor communication and processor-to-memory communication through configuration setting without requiring hardware modifications. An additional benefit is the ability to use a single architecture for both high-end and low-end systems. Yet another benefit is the ability to use a single set of connections and sockets to support both processor-to-processor communication and processor-to-memory communication.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire line, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A multi-use physical (PHY) architecture comprising:
a PHY connection including one or more bit lines, the PHY connection communicatively coupled to a first processor;
the PHY connection configurable to carry signals between the first processor and a second processor, or between the first processor and a memory;
the one or more bit lines configured to carry signals bi-directionally at a first voltage in a first setting for the PHY connection when the PHY connection is configured to carry signals between the first processor and the memory, wherein data is transferred over the one or more bit lines using a bursting strobe signal; and
the one or more bit lines configured to carry signals uni-directionally at a second voltage in a second setting for the PHY connection when the PHY connection is configured to carry signals between the first processor and the second processor, wherein data is transferred over the one or more bit lines using a continuous clock signal and the second voltage different than the first voltage.

2. The multi-use PHY architecture of claim 1, wherein the PHY connection is configured using only software.

3. The multi-use PHY architecture of claim 1, wherein the memory is double data rate four (DDR4) memory.

4. The multi-use PHY architecture of claim 1, wherein the memory is double data rate three (DDR3).

5. The multi-use PHY architecture of claim 1, wherein a single oxide is used for communication to both the memory and the second processor.

6. The multi-use PHY architecture of claim 1, wherein the PHY connection is configured to switch between the bursting strobe signal and the continuous clock signal in software.

7. The multi-use PHY architecture of claim 1, wherein the one or more bit lines are configured to carry signals uni-directionally by disabling a data query driver.

8. The multi-use PHY architecture of claim 1, wherein the one or more bit lines are configured to carry signals uni-directionally by disabling a data query receiver.

9. A computer implemented method for configuring a multi-use physical (PHY) connection including comprising:
determining if the multi-use PHY connection connects a first processor to a memory or to a second processor;
configuring, via a system programming module, the multi-use PHY connection, the configuring comprising:
setting one or more bit lines to carry signals uni-directionally in response to determining that the multi-use PHY connection connects the first processor to the second processor, wherein data is transferred over the one or more bit lines using a bursting strobe signal in a first setting for the PHY connection connecting the first processor to the second processor; and
setting the one or more bit lines to carry signals bi-directionally in response to determining that the multi-use PHY connection connects the first processor to the memory wherein data is transferred over the one or more bit lines using a continuous clock signal in a second setting for the PHY connection connecting the first processor to the memory.

10. The method of claim 9, wherein the multi-use PHY connection is configured to switch between the bursting strobe signal and the continuous clock signal in software.

11. A multi-use physical (PHY) connection including:
a first pad communicatively coupled to a second pad via one or more bit lines, the first pad communicatively coupled to a first processor;
the first pad configurable to carry signals between the first processor and the second pad, the second pad communicatively coupled to a second processor or to a memory;
the one or more bit lines configured to carry signals bi-directionally at a first voltage in a first setting for the second pad when the second pad is communicatively coupled to the memory, wherein data is transferred over the one or more bit lines using bursting strobe signal; and
the one or more bit lines configured to carry signals uni-directionally at a second voltage in a second setting for the second pad when the second pad is communicatively coupled to the second processor, wherein data is transferred over the one or more bit lines using a continuous clock signal and the second voltage is different than the first voltage.

12. The multi-use PHY connection of claim 11, wherein the first pad is configured using only software.

13. The multi-use PHY connection of claim 11, wherein the memory is double data rate four (DDR4) memory.

14. The multi-use PHY connection of claim 11, wherein the memory is double data rate three (DDR3).

15. The multi-use PHY connection of claim 11, wherein a single oxide is used for communication to both the memory and the second processor.

16. The multi-use PHY connection of claim 11, wherein the first pad is configured to switch between the bursting strobe signal and the continuous clock signal in software.

17. The multi-use PHY connection of claim 11, wherein the one or more bit lines are configured to carry signals uni-directionally by disabling one or both of a data query driver and a data query receiver.

* * * * *